(12) United States Patent
Hamada et al.

(10) Patent No.: US 10,593,751 B2
(45) Date of Patent: Mar. 17, 2020

(54) SEMICONDUCTOR DEVICE AND METHOD FOR MANUFACTURING SEMICONDUCTOR DEVICE

(71) Applicant: Mitsubishi Electric Corporation, Chiyoda-ku (JP)

(72) Inventors: Kenji Hamada, Tokyo (JP); Kohei Ebihara, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/300,348

(22) PCT Filed: Apr. 10, 2017

(86) PCT No.: PCT/JP2017/014675
§ 371 (c)(1),
(2) Date: Nov. 9, 2018

(87) PCT Pub. No.: WO2017/212773
PCT Pub. Date: Dec. 14, 2017

(65) Prior Publication Data
US 2019/0148485 A1 May 16, 2019

(30) Foreign Application Priority Data
Jun. 10, 2016 (JP) .................................. 2016-116101

(51) Int. Cl.
*H01L 29/06* (2006.01)
*H01L 29/78* (2006.01)
(Continued)

(52) U.S. Cl.
CPC .......... *H01L 29/0634* (2013.01); *H01L 29/06* (2013.01); *H01L 29/0623* (2013.01);
(Continued)

(58) Field of Classification Search
USPC ................................................. 257/493, 438
(Continued)

(56) References Cited

U.S. PATENT DOCUMENTS

| 8,421,152 B2 | 4/2013 | Sasaki |
| 2007/0013412 A1 | 1/2007 | Yamauchi et al. |

(Continued)

FOREIGN PATENT DOCUMENTS

| JP | 2007-5516 A | 1/2007 |
| JP | 2007-157797 A | 6/2007 |
| JP | 4844605 B2 | 12/2011 |

OTHER PUBLICATIONS

International Search Report dated Jun. 27, 2017 in PCT/JP2017/014675 filed Apr. 10, 2017.
(Continued)

*Primary Examiner* — Hrayr A Sayadian
(74) *Attorney, Agent, or Firm* — Oblon, McClelland, Maier & Neustadt, L.L.P.

(57) ABSTRACT

An object of the present invention is to provide a semiconductor device capable of satisfactorily securing a breakdown voltage not only in a cell region but also in an edge termination region in a super junction structure. A semiconductor device according to the present invention includes a drift region of a first conductivity type and a pillar region of a second conductivity type a RESURF layer formed across a plurality of the pillar regions in an edge termination region and extending in the thickness direction from surfaces of the drift region and the pillar region, and a high-concentration region of the second conductivity type formed in a surface of the RESURF layer, the high-concentration region being higher in impurity concentration than the RESURF layer, no pillar region being formed under the high-concentration region in the thickness direction.

13 Claims, 13 Drawing Sheets

(51) Int. Cl.
  *H01L 29/12* (2006.01)
  *H01L 29/66* (2006.01)
  *H01L 21/04* (2006.01)
  *H01L 29/16* (2006.01)

(52) U.S. Cl.
  CPC .......... *H01L 29/0696* (2013.01); *H01L 29/12* (2013.01); *H01L 29/66068* (2013.01); *H01L 29/78* (2013.01); *H01L 29/7811* (2013.01); H01L 21/0465 (2013.01); H01L 29/1608 (2013.01)

(58) Field of Classification Search
  IPC .......... H01L 29/0634,29/06, 29/0623, 29/0696, 29/12, 29/66068, 29/78, 29/7811, 21/0465, 29/1608
  See application file for complete search history.

(56) References Cited

U.S. PATENT DOCUMENTS

2010/0032791 A1\* 2/2010 Hozumi .............. H01L 29/0615
  257/493
2010/0264489 A1\* 10/2010 Ohta ................... H01L 29/0634
  257/334

OTHER PUBLICATIONS

Tatsuhiko Fujihara, "Theory of Semiconductor Superjunction Devices," Japanese Journal of Applied Physics, vol. 36, Part 1, No. 10, Oct. 1997, pp. 6254-6262.

G. Deboy, et al., "A new generation of high voltage MOSFETs breaks the limit line of silicon," IEEE International Electron Devices Meeting, 1998, pp. 683-685.

\* cited by examiner

F I G . 3
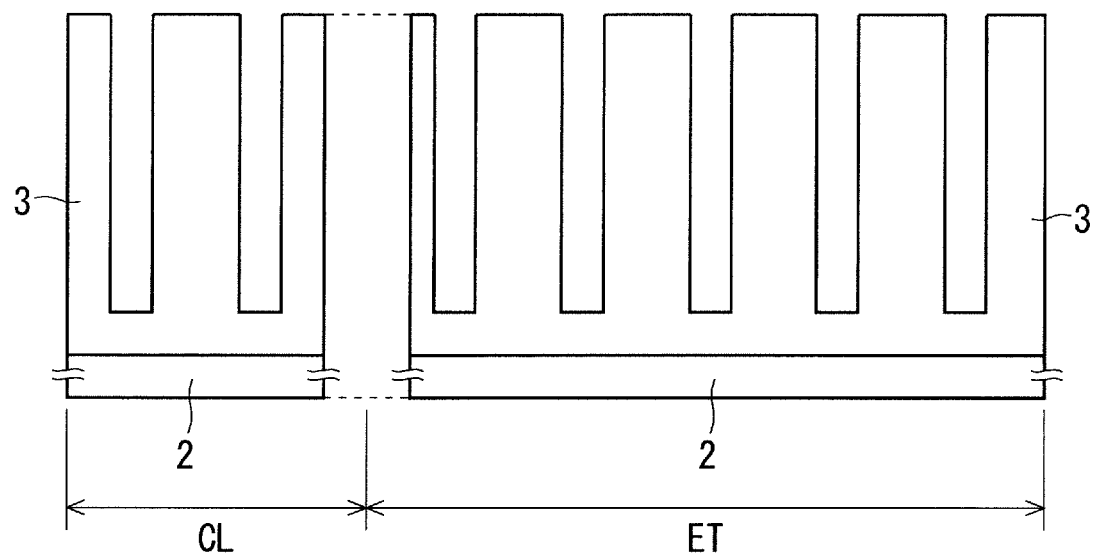
F I G . 4
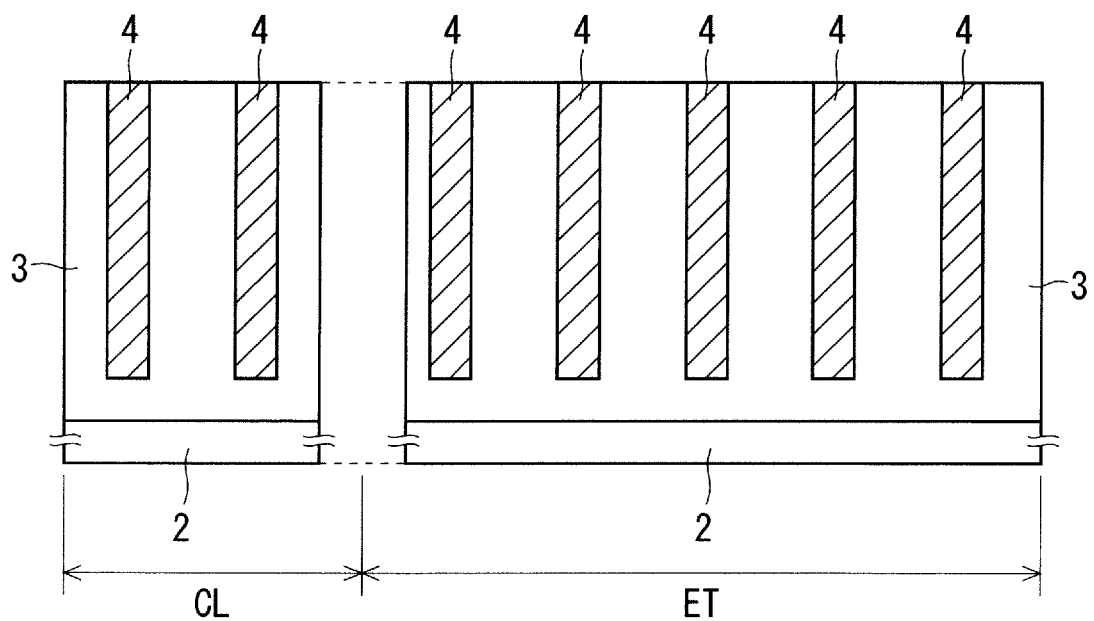

F I G . 9
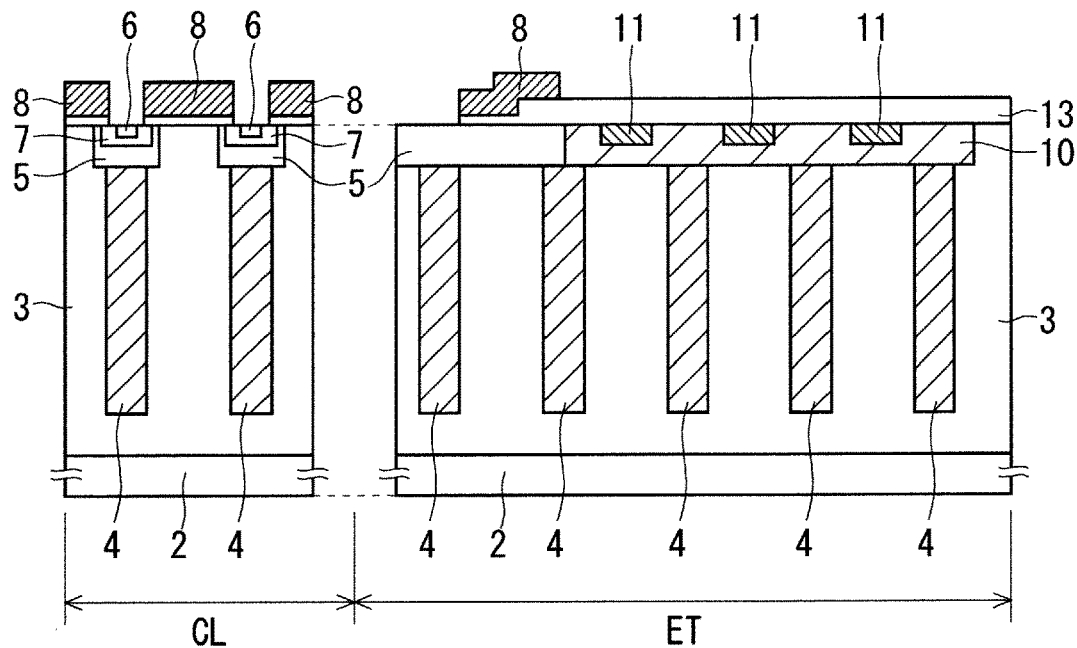
F I G . 1 0
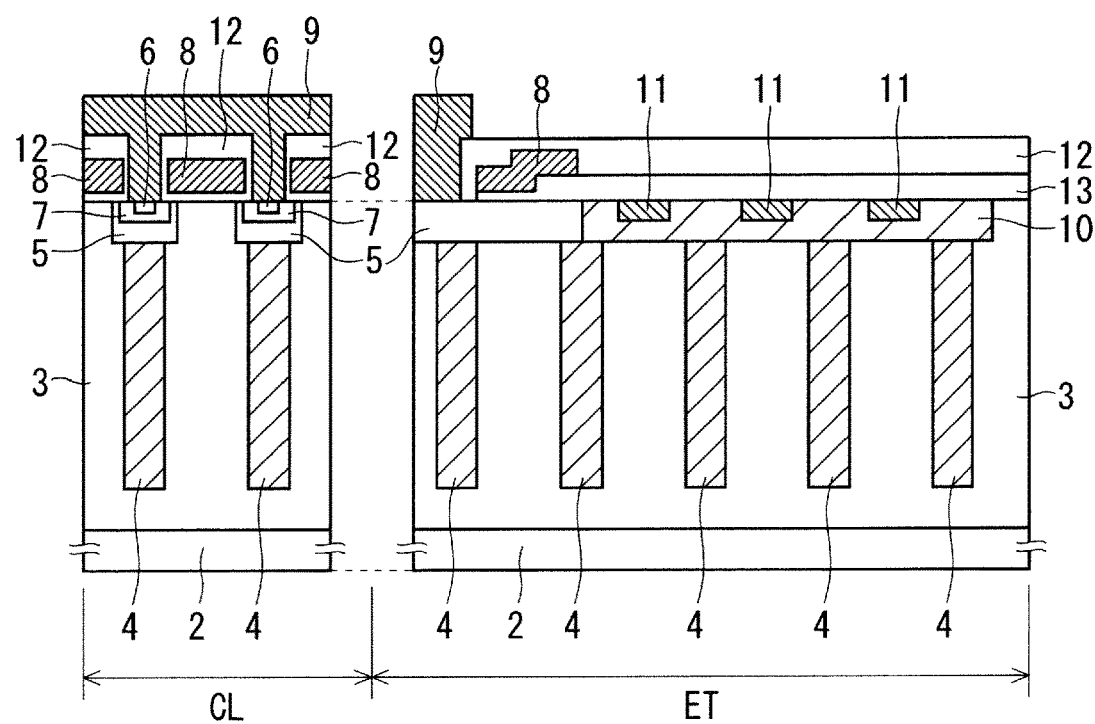

F I G . 1 6
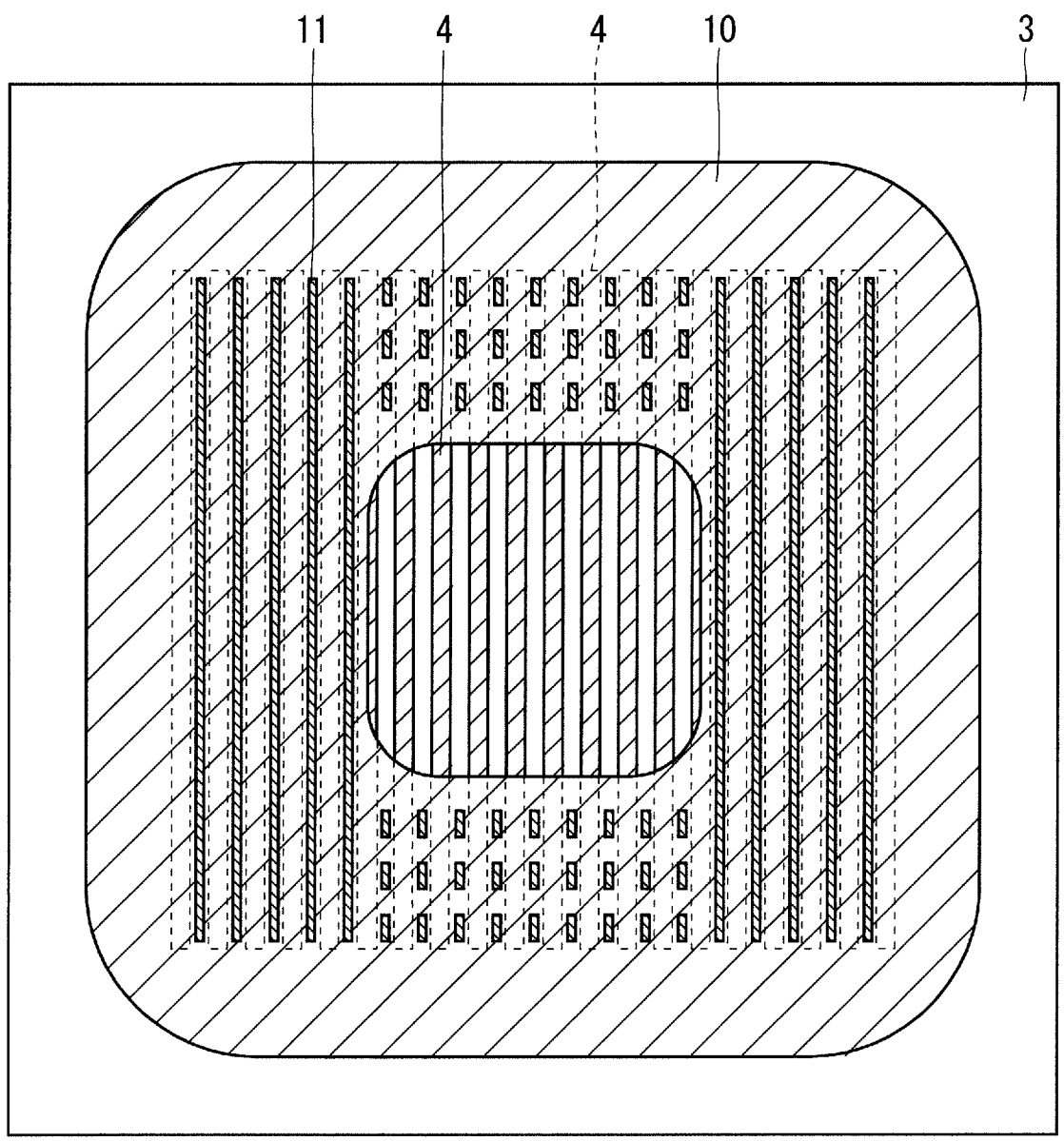

F I G . 1 9
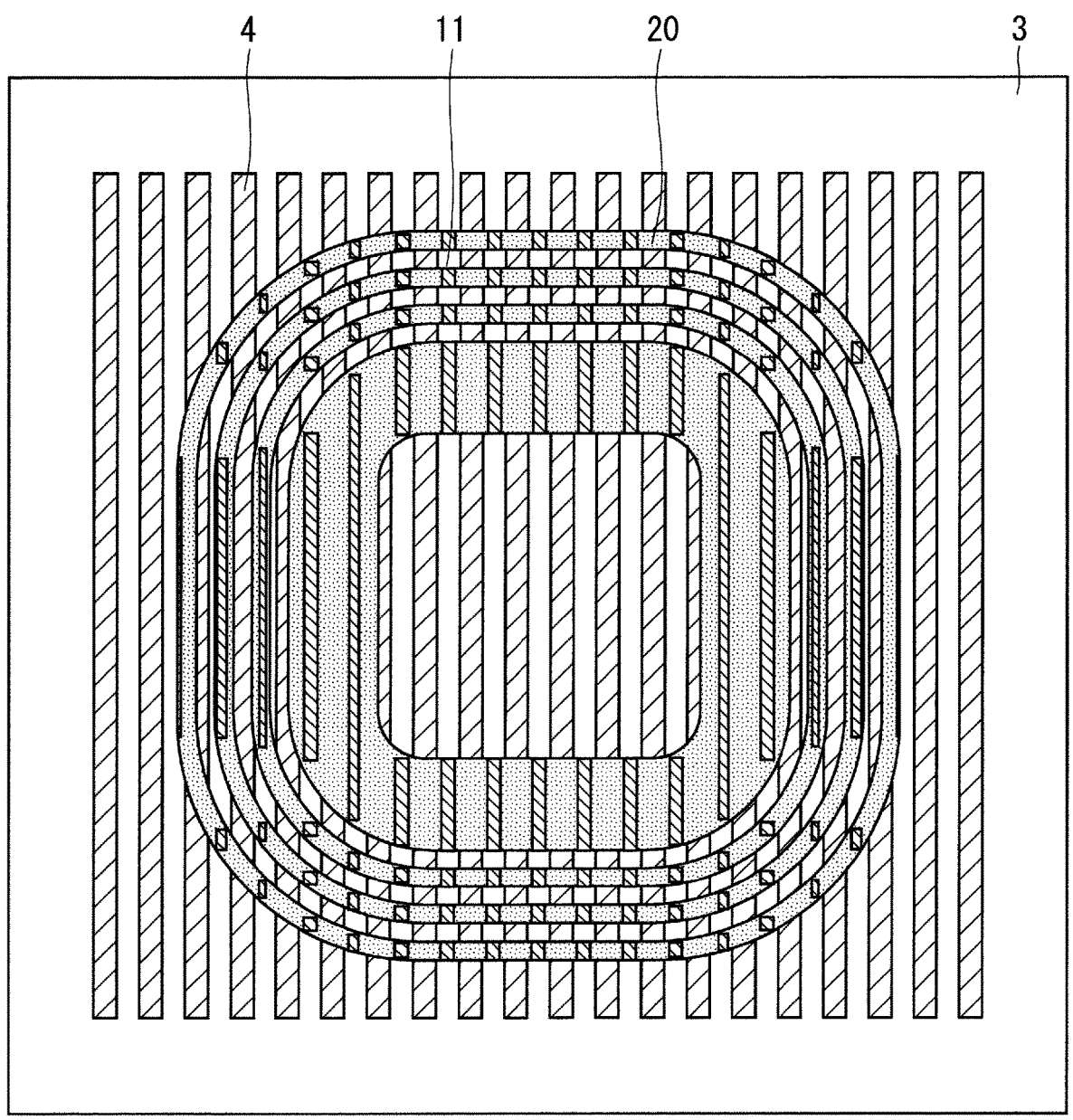

SEMICONDUCTOR DEVICE AND METHOD FOR MANUFACTURING SEMICONDUCTOR DEVICE

TECHNICAL FIELD

The present invention relates to a semiconductor device and a method for manufacturing a semiconductor device.

BACKGROUND ART

Power semiconductor devices are roughly divided into two types: a lateral semiconductor device in which electrodes are formed on one side and a current flows in a horizontal direction, and a vertical semiconductor device in which electrodes are formed on both sides and a current flows in a vertical direction. Examples of the vertical semiconductor device include a planar gate n-channel vertical metal-oxide-semiconductor field effect transistor (MOSFET). Hereinafter, the planar gate n-channel vertical MOSFET is also referred to as a vertical MOSFET.

In the vertical MOSFET, an n-type drift layer having high-resistance serves as a region that, in an on state, allows a drift current to flow in the vertical direction, and, in an off state, causes a depletion layer to widen in the vertical direction under application of a reverse bias voltage. When a current path of the n-type drift layer is shortened, that is, a thickness of the n-type drift layer is reduced, a drift resistance is lowered, thereby allowing a substantial on-resistance of the vertical MOSFET to be reduced. However, a width of a drain-to-source depletion layer stretched from a p-n junction formed between a p-type well region and the n-type drift layer is reduced, thereby causing a critical electric field intensity of the semiconductor to be reached at a relatively low voltage and thus causing a substantial breakdown voltage of the vertical MOSFET to decrease. In contrast, when the thickness of the n-type drift layer is increased, the breakdown voltage of the vertical MOSFET increases, but the on-resistance of the vertical MOSFET increases, and thus a loss as a semiconductor element increases. As described above, a trade-off relationship exists in principle between the on-resistance and the breakdown voltage of the vertical MOSFET. The trade-off relationship also applies to semiconductor devices other than a MOSFET such as an insulated gate bipolar transistor (IGBT), a bipolar junction transistor (BJT), a schottky barrier diode (SBD), and a p-intrinsic-n (PiN) diode.

As a technique for solving in principle the above-described trade-off relationship, a semiconductor device having a structure based on a super junction technique is known, the structure based on a super junction technique corresponding to a parallel p-n structure in which the drift layer is divided into an n-type drift region and a p-type pillar region, both of the regions having high concentration, and the n-type drift region and the p-type pillar region are alternately and repeatedly bonded in the horizontal direction (for example, refer to Non-Patent Documents 1 and 2). Hereinafter, the structure based on a super junction technique is referred to as a super junction (SJ) structure.

In the semiconductor device having the super junction structure, even when both the n-type drift region and the p-type pillar region in the parallel p-n structure have high concentration, in the off state, a depletion layer is stretched in the horizontal direction from each p-n junction extending in the vertical direction of the parallel p-n structure to cause the entire drift layer to be depleted, which achieves both low on-resistance and high breakdown voltage.

Further, as a semiconductor material used for a power semiconductor device, silicon carbide (hereinafter referred to as SiC) instead of conventional silicon (hereinafter referred to as Si) has attracted attention. A semiconductor device formed of SiC is capable of high-speed operation and high-temperature operation with low on-resistance, that is, low loss as compared with a semiconductor device formed of Si. This is because SiC has excellent material physical properties as a semiconductor material. Specifically, SiC has a large band gap of about 3 eV and can be used extremely stably even at high temperatures. A dielectric breakdown electric field of SiC is one order of magnitude larger than a dielectric breakdown electric field of Si, which achieves low on-resistance.

SiC is expected to be applied particularly to a MOSFET among power semiconductor devices in the future as a semiconductor material having a high possibility of exceeding a physical limit of Si. Specifically, great expectations have been placed on an SiC-SJ-MOSFET that achieves both low on-resistance and high breakdown voltage. Herein, the SiC-SJ-MOSFET refers to a MOSFET having the super junction structure using SiC. Note that, in the following description, the SiC-SJ-MOSFET and the Si-SJ-MOSFET are collectively referred to as an SJ-MOSFET.

The typical SiC-SJ-MOSFET is similar in cross-sectional structure to the Si-SJ-MOSFET. In the SJ-MOSFET, breakdown voltage and avalanche resistance are influenced by not only a structure of a region where the MOSFET operates actively, but also a structure of a region provided around a cell region. Therefore, it is required that the structure of the cell region and the structure of the edge termination region of the SJ-MOSFET be appropriately designed. Note that the avalanche resistance refers to an energy that a semiconductor device withstands without being destroyed when a voltage exceeding a maximum rating is applied to the device. Further, a region where the MOSFET operates actively is referred to as a cell region, an activated region, an effective region, an active region, an element region, or the like, and is hereinafter typically referred to as a cell region. A region provided around the cell region is referred to as an edge termination region, a peripheral region, a junction edge termination region, an element peripheral region, or the like, and is hereinafter typically referred to as an edge termination region.

Conventionally, a semiconductor device is disclosed in which a p-type region is formed on a surface portion adjacent to a source electrode and all p-type pillar regions and the p-type region in an edge termination region are electrically connected (for example, refer to Patent Document 1). Here, the p-type region is referred to as a RESURF layer, a junction termination extension (JTE), a depletion layer extending layer, or the like, and is hereinafter typically referred to as a RESURF layer. In the semiconductor device disclosed in Patent Document 1, when a high voltage is applied to the drain electrode, the depletion layer is surely expanded to an edge of the device, which achieves higher breakdown voltage. That is, stable higher breakdown voltage is achieved not only in the cell region but also in the edge termination region by formation of the cell region and the edge termination region in the super junction structure and formation of the RESURF layer in the edge termination region.

PRIOR ART DOCUMENTS

Patent Document

Patent Document 1: Japanese Patent No. 4844605

Non-Patent Documents

Non-Patent Document 1: Tatsuhiko Fujihira, "Theory of Semiconductor Superjunction Devices", Japanese Journal of Applied Physics, 1997, Vol. 36, Part 1, No. 10, pp. 6254-6262

Non-Patent Document 2: G. Deboy, and five others, "A new generation of high voltage MOSFETs breaks the limit line of silicon", IEEE International Electron Devices Meeting, (USA), December 1998, pp. 683-685

SUMMARY

Problem to be Solved by the Invention

Hereinafter, a planar gate SJ-MOSFET that is one of SJ-MOSFETs will be considered. In the planar gate SJ-MOSFET, it is required that a p-type pillar region be formed under a p-type well region. Further, in a cell region, it is required that an interval between the p-type well regions adjacent to each other in the horizontal direction with an n-type drift region interposed between the p-type well regions have a certain length in order to reduce on-resistance of the SJ-MOSFET; thus, an interval between the p-type pillar regions is also required to have a certain length. In such a super junction structure in which the interval between the p-type pillar regions is large, applying a high voltage to a drain electrode in a configuration where a RESURF layer is formed in an edge termination region causes potential balance among the p-type pillar regions in the edge termination region to be lost. Therefore, there is a problem that a high electric field concentrates at an end of the p-type pillar region, and a breakdown voltage of the edge termination region drops greatly. This problem is common among planar gate SJ-MOSFETs, and it is presumed that a similar problem will occur in SiC-SJ-MOSFETs.

The present invention has been conceived to solve such a problem, and an object of the present invention is to provide a semiconductor device capable of satisfactorily securing a breakdown voltage not only in a cell region but also in an edge termination region in a super junction structure.

Means to Solve the Problem

In order to solve the above problem, a semiconductor device according to the present invention is a semiconductor device having a cell region that is an operation region and an edge termination region provided around the cell region in plan view, the semiconductor device including a substrate, a drift region of a first conductivity type and a pillar region of a second conductivity type, the drift region extending in a thickness direction on the substrate and the pillar region extending in the thickness direction over the substrate, the drift region and the pillar region being alternately formed in an orthogonal direction with respect to the thickness direction across the cell region and the edge termination region, a RESURF layer of the second conductivity type formed across a plurality of the pillar regions in the edge termination region and extending in the thickness direction from surfaces of the drift region and the pillar region, and a high-concentration region of the second conductivity type formed in a surface of the RESURF layer, the high-concentration region being higher in impurity concentration than the RESURF layer, in which no pillar region is formed under the high-concentration region in the thickness direction.

Further, a method for manufacturing a semiconductor device according to the present invention is a method for manufacturing a semiconductor device having a cell region that is an operation region and an edge termination region provided around the cell region in plan view, the method including the steps of (a) preparing a substrate, (b) forming a drift region of a first conductivity type and a pillar region of a second conductivity type, the drift region extending in a thickness direction on the substrate and the pillar region extending in the thickness direction over the substrate, the drift region and the pillar region being alternately formed in an orthogonal direction with respect to the thickness direction across the cell region and the edge termination region, (c) forming a RESURF layer of the second conductivity type across a plurality of the pillar regions in the edge termination region, the RESURF layer extending in the thickness direction from surfaces of the drift region and the pillar region; and (d) forming a high-concentration region of the second conductivity type in a surface of the RESURF layer, the high-concentration region being higher in impurity concentration than the RESURF layer, no pillar region being formed under the high-concentration region in the thickness direction.

Effects of the Invention

According to the present invention, the semiconductor device has the cell region that is an operation region and the edge termination region provided around the cell region in plan view and includes the substrate, the drift region of the first conductivity type and the pillar region of the second conductivity type, the drift region extending in the thickness direction on the substrate and the pillar region extending in the thickness direction over the substrate, the drift region and the pillar region being alternately formed in the orthogonal direction with respect to the thickness direction across the cell region and the edge termination region, the RESURF layer of the second conductivity type formed across a plurality of the pillar regions in the edge termination region and extending in the thickness direction from surfaces of the drift region and the pillar region, and the high-concentration region of the second conductivity type formed in a surface of the RESURF layer, the high-concentration region being higher in impurity concentration than the RESURF layer, in which no pillar region is formed under the high-concentration region in the thickness direction, thereby allowing a breakdown voltage to be satisfactorily secured not only in the cell region but also in the edge termination region in the super junction structure.

Further, the method for manufacturing a semiconductor device having the cell region that is an operation region and the edge termination region provided around the cell region in plan view includes the steps of (a) preparing the substrate, (b) forming the drift region of the first conductivity type and the pillar region of the second conductivity type, the drift region extending in the thickness direction on the substrate and the pillar region extending in the thickness direction over the substrate, the drift region and the pillar region being alternately formed in the orthogonal direction with respect to the thickness direction across the cell region and the edge termination region, (c) forming the RESURF layer of the second conductivity type across a plurality of the pillar regions in the edge termination region, the RESURF layer extending in the thickness direction from surfaces of the drift region and the pillar region; and (d) forming the high-concentration region of the second conductivity type in a surface of the RESURF layer, the high-concentration region being higher in impurity concentration than the RESURF layer, no pillar region being formed under the high-concentration region in the thickness direction, thereby allowing a breakdown voltage to be satisfactorily secured not only in the cell region but also in the edge termination region in the super junction structure.

The objects, features, aspects, and advantages of the present invention will become more apparent from the following detailed description and the accompanying drawings.

BRIEF DESCRIPTION OF DRAWINGS

FIG. 3 is a cross-sectional view of the example of the manufacturing process of the semiconductor device according to the first embodiment of the present invention.

FIG. 4 is a cross-sectional view of the example of the manufacturing process of the semiconductor device according to the first embodiment of the present invention.

FIG. 9 is a cross-sectional view of the example of the manufacturing process of the semiconductor device according to the first embodiment of the present invention.

FIG. 10 is a cross-sectional view of the example of the manufacturing process of the semiconductor device according to the first embodiment of the present invention.

FIG. 16 is a plan view of an example of a structure of a semiconductor device according to a fourth embodiment of the present invention.

FIG. 19 is a plan view of an example of a structure of a semiconductor device according to a fifth embodiment of the present invention.

DESCRIPTION OF EMBODIMENTS

Embodiments of the present invention will be described below with reference to the drawings.

First Embodiment

Structure

First, a structure of a semiconductor device according to a first embodiment of the present invention will be described. In the first embodiment, a planar gate SiC-SJ-MOSFET using SiC as a semiconductor material will be described as an example.

Figure 1:
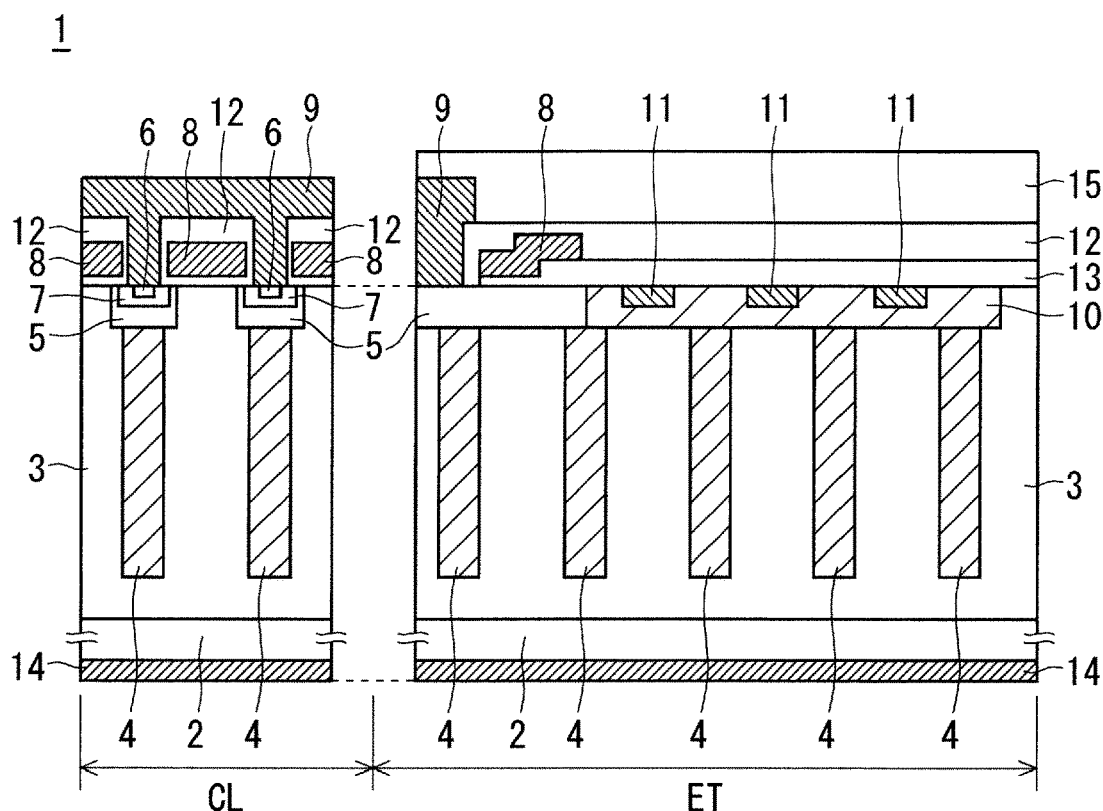
FIG. 1 is a cross-sectional view of an example of a structure of a semiconductor device according to a first embodiment of the present invention.

FIG. 1 is a cross-sectional view of an example of a structure of a semiconductor device 1 according to the first embodiment, showing a cross section of a planar gate SiC-SJ-MOSFET.

As shown in FIG. 1, on one main surface side of an SiC substrate 2 of a first conductivity type, the SiC substrate 2 having a relatively high impurity concentration, a drift region 3 of the first conductivity type that is lower in impurity concentration than the SiC substrate 2 is formed. On the other main surface side of the SiC substrate 2, a drain electrode 14 is formed. In the drift region 3, a plurality of pillar regions 4 of a second conductivity type are formed at predetermined intervals, each of the pillar regions 4 extending from a surface of the drift region 3 to a depth before the main surface of the SiC substrate 2. That is, the drift region 3 extends in a thickness direction on the SiC substrate 2, the pillar regions 4 extend in the thickness direction over the SiC substrate 2, and the drift region 3 and the pillar regions 4 are alternately formed across a cell region CL and an edge termination region FT in a direction orthogonal to the thickness direction. Note that, a description will be given below on the assumption that the first conductivity type denotes n type and the second conductivity type denotes p type.

The semiconductor device 1 is divided into the cell region CL and the edge termination region ET. For example, the cell region CL is several millimeters square in plan view, and the edge termination region ET has a width of several hundreds of micrometers in plan view. In the cell region CL, a well region 5 of the second conductivity type, a well contact region 6 of the second conductivity type, and a source region 7 of the first conductivity type are formed on each of the pillar regions 4. A gate electrode 8 is formed apart from the well region 5 with a gate insulating film interposed between the gate electrode 8 and the well region 5. A source electrode 9 is formed on surfaces of the well contact region 6 and the source region 7 and apart from the gate electrode 8 with an interlayer insulating film 12 interposed between the source electrode 9 and the gate electrode 8.

In the edge termination region ET, a reduced surface field (RESURF) layer 10 of the second conductivity type is formed across a plurality of pillar regions 4 and extending from surfaces of the drift region 3 and the pillar regions 4 in the thickness direction. In a surface of the RESURF layer 10, high-concentration regions 11 of the second conductivity type that are higher in impurity concentration than the RESURF layer 10 are formed. Further, no pillar region 4 is formed under each of the high-concentration regions 11 in the thickness direction.

Manufacturing Process

Next, a method for manufacturing the semiconductor device 1 will be described. FIGS. 2 to 10 are cross-sectional views showing an example of a manufacturing process of the semiconductor device 1.

Figure 2:
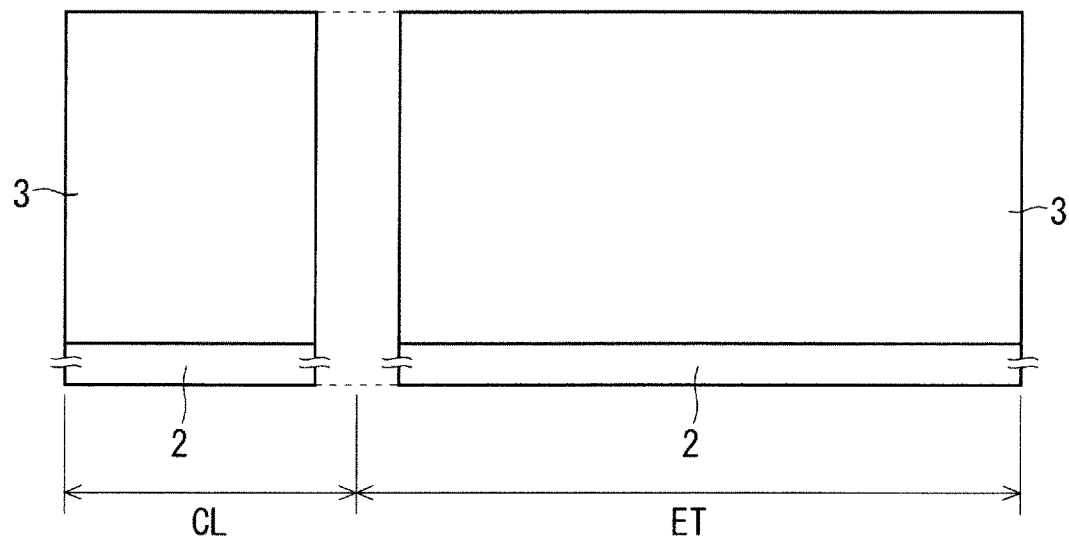
FIG. 2 is a cross-sectional view of an example of a manufacturing process of the semiconductor device according to the first embodiment of the present invention.

First, as shown in FIG. 2, on a main surface on one side of the SiC substrate 2 of the first conductivity type, the drift region 3 of the first conductivity type that is lower in impurity concentration than the SiC substrate 2 is formed by epitaxial growth. The impurity concentration of the drift region 3 is desirably in a range of $1 \times 10^{15}$ cm$^{-3}$ to $1 \times 10^{18}$ cm$^{-3}$. Further, a thickness of the drift region 3 is desirably in a range of 2 µm to 150 µm.

Next, as shown in FIG. 3, a plurality of grooves (hereinafter referred to as trenches) are formed extending from the surface of the drift region 3 to a depth before the SiC substrate 2. A width of the trenches is desirably 1 µm to 5 µm, each interval between the trenches is desirably 1 µm to 15 µm, and a depth of the trenches is desirably 2 µm to 150 µm. Although a bottom surface of each of the trenches desirably does not come into contact with the SiC substrate 2, the bottom surface may come into contact with the SiC substrate 2.

Next, as shown in FIG. 4, after an epitaxial layer of the second conductivity type is formed in the plurality of trenches formed in the drift region 3, chemical mechanical polishing (CMP) is performed on the drift region 3 from the surface side of the drift region 3. As a result, the plurality of pillar regions 4 of the second conductivity type are formed at intervals and extending from the surface of the drift region 3 to a depth before the SiC substrate 2. In other words, the drift region 3 is interposed between each of the pillar regions 4 and the SiC substrate 2. An impurity concentration of the pillar regions 4 is desirably in a range of $1 \times 10^{15}$ cm$^{-3}$ to $1 \times 10^{18}$ cm$^{-3}$. A thickness of the pillar regions 4 is desirably in a range of 2 µm to 150 µm.

Note that, in the first embodiment, as a method for forming the plurality of pillar regions 4 of the second conductivity type, a method in which trenches are formed and then the epitaxial layer of the second conductivity type is formed in the trenches by epitaxial growth has been described as an example. However, the first embodiment of the present invention is not limited to this method. For example, the plurality of pillar regions 4 of the second conductivity type may be formed by a method in which epitaxial growth of the drift region 3 of the first conductivity type and ion implantation of an impurity of the second conductivity type are repeated to form the pillar regions 4.

Figure 5:
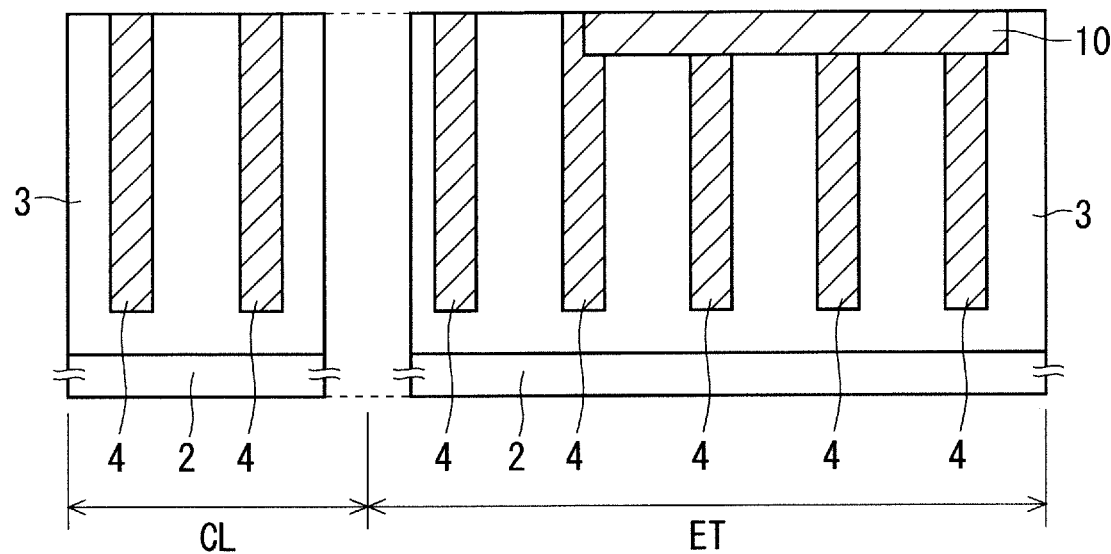
FIG. 5 is a cross-sectional view of the example of the manufacturing process of the semiconductor device according to the first embodiment of the present invention.

Next, as shown in FIG. 5, an ion implantation process is performed on a predetermined region of the surface of the drift region 3 in the edge termination region ET to form the RESURF layer 10 of the second conductivity type extending across the plurality of pillar regions 4. The impurity concentration of the RESURF layer 10 is desirably in a range of $1 \times 10^{15}$ cm$^{-3}$ to $1 \times 10^{19}$ cm$^{-3}$ and is desirably higher than the impurity concentration of the drift region 3 and equal to or less than $1 \times 10^{19}$ cm$^{-3}$. A thickness of the RESURF layer 10 is desirably in a range of 0.5 µm to 3 µm. When the RESURF layer 10 is lower in impurity concentration than the pillar regions 4, the pillar regions 4 extend to the surface of the RESURF layer 10.

Figure 6:
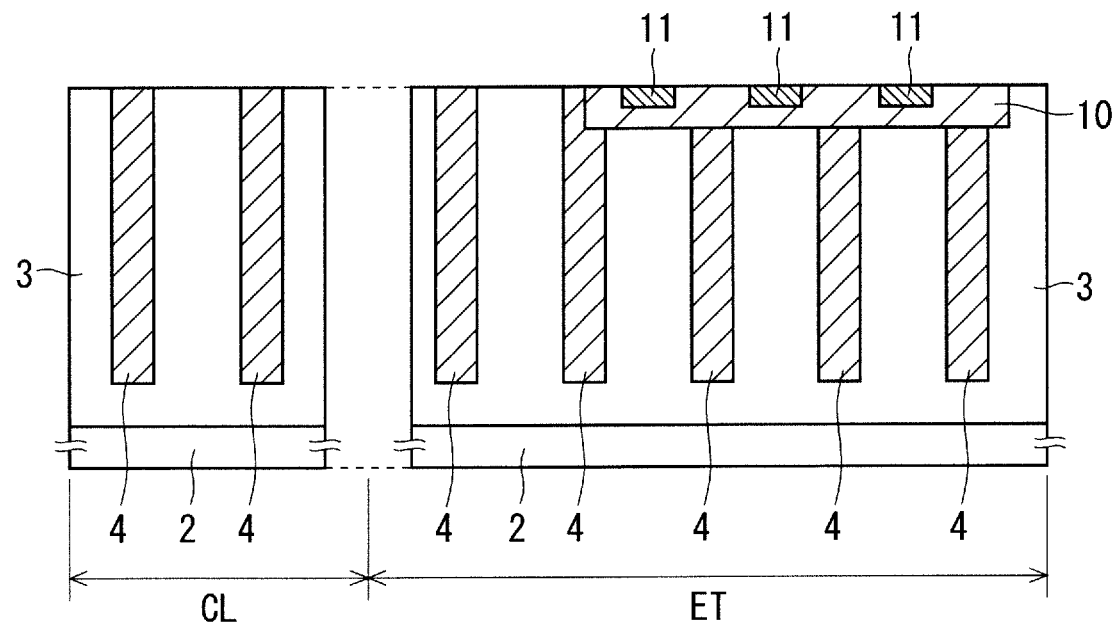
FIG. 6 is a cross-sectional view of the example of the manufacturing process of the semiconductor device according to the first embodiment of the present invention.

Next, as shown in FIG. 6, an ion implantation process is performed on the surface of the drift region 3 in the edge termination region ET between the pillar regions 4 in plan view to form the high-concentration regions 11 of the second conductivity type. No pillar region 4 is formed under each of the high-concentration regions 11 in the thickness direction. The high-concentration regions 11 may be formed between all the pillar regions 4 across which the RESURF layer 10 is formed. The impurity concentration of the high-concentration regions 11 is higher than the impurity concentration of the RESURF layer 10 and is desirably falls within a range of $1 \times 10^{17}$ cm$^{-3}$ to $1 \times 10^{21}$ cm$^{-3}$. A thickness of each of the high-concentration regions 11 is desirably in a range of 0.5 µm to 3 µm and is desirably less than the thickness of the RESURF layer 10.

Figure 7:
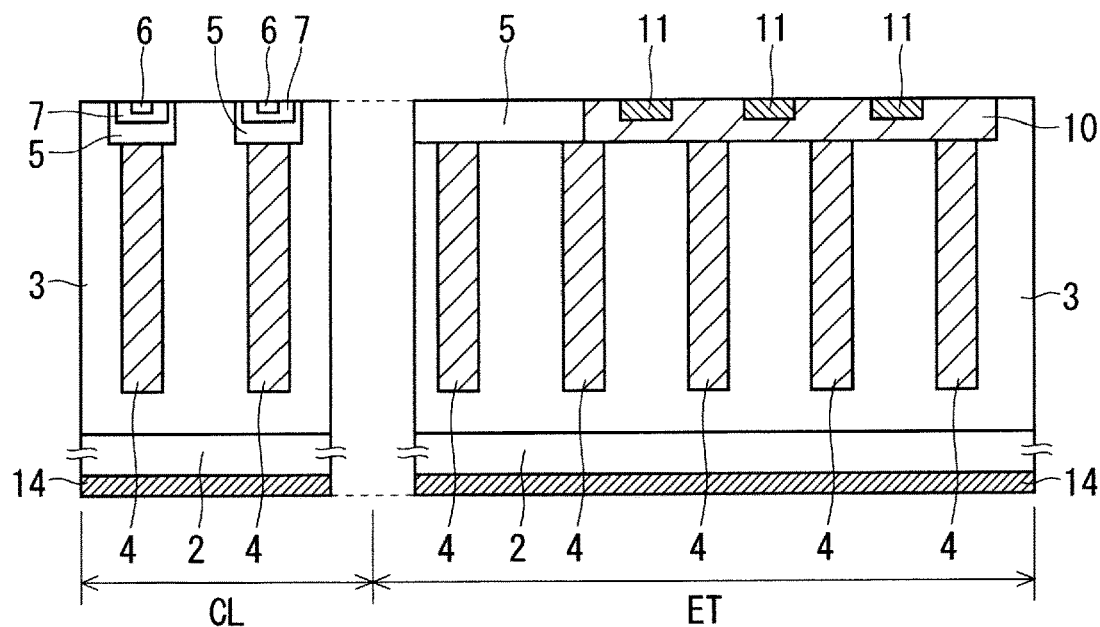
FIG. 7 is a cross-sectional view of the example of the manufacturing process of the semiconductor device according to the first embodiment of the present invention.

Next, as shown in FIG. 7, the ion implantation process is performed on a predetermined region on the surface of the drift region 3 in the cell region CL and the edge termination region ET to form the well regions 5 of the second conductivity type. Further, the ion implantation process is performed on a predetermined region on the surface of the drift region 3 in the cell region CL to form the source region 7 of the first conductivity type and the well contact region 6 of the second conductivity type. An impurity concentration of the well region 5 is desirably in a range of $1 \times 10^{17}$ cm$^{-3}$ to $1 \times 10^{19}$ cm$^{-3}$. An impurity concentration of the source region 7 is desirably in a range of $1 \times 10^{18}$ cm$^{-3}$ to $1 \times 10^{20}$ cm$^{-3}$. An impurity concentration of the well contact region 6 is desirably in a range of $1 \times 10^{19}$ cm$^{-3}$ to $1 \times 10^{21}$ cm$^{-3}$. A thickness of the well region 5 is desirably in a range of 0.5 µm to 3 µm. A thickness of the source region 7 is desirably in a range of 0.2 µm to 1 µm. A thickness of the well contact region 6 is desirably in a range of 0.2 µm to 1 µm.

Note that the ion implantation process performed for forming the RESURF layer 10, the high-concentration region 11, the well region 5, the source region 7, and the well contact region 6 may be performed at a single implantation energy, or may be performed at an implantation energy that is changed stepwise from high to low, for example. Further, the ion implantation process is performed via an implantation mask to make the predetermined region subjected to ion implantation. As the implantation mask, for example, a photoresist or oxide film for photolithography is used. A density of an injection surface at the time of the ion implantation process is desirably in a range of $1 \times 10^{13}$ cm$^{-2}$ to $1 \times 10^{16}$ cm$^{-2}$, the implantation energy is desirably in a range of 10 keV to 10 MeV. A temperature of the SiC substrate 2 during the ion implantation process is desirably in a range of 10° C. to 1000° C. Examples of dopant atoms used for the ion implantation process include aluminum, boron, phosphorus, nitrogen, and the like.

After the manufacturing process shown in FIG. 7, the SiC substrate 2 is heated. As a result, ion-implanted dopant atoms are activated. A temperature at which the SiC substrate 2 is heated is desirably in a range of 1400° C. to 1800° C.

Figure 8:
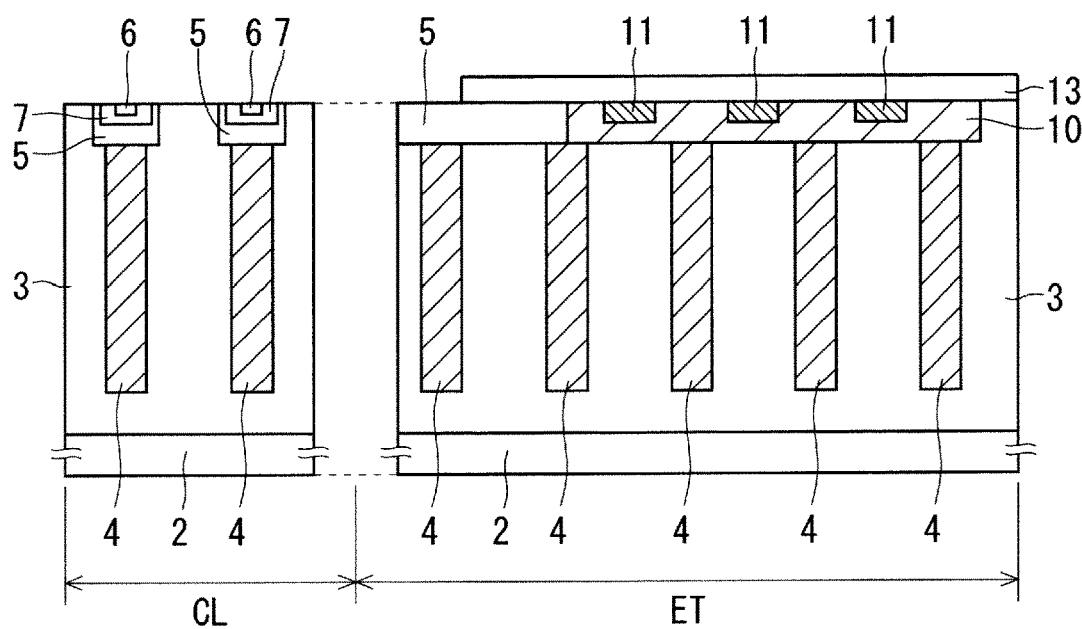
FIG. 8 is a cross-sectional view of the example of the manufacturing process of the semiconductor device according to the first embodiment of the present invention.

Next, as shown in FIG. 8, a field oxide film 13 is formed to cover the drift region 3, the RESURF layer 10, the high-concentration regions 11, and a part of the well region 5 in the edge termination region ET. A thickness of the field oxide film 13 is desirably in a range of 500 nm to 5 µm, for example.

After the manufacturing process shown in FIG. 8, the SiC substrate 2 is thermally oxidized in an oxygen atmosphere to form a gate insulating film. A thickness of the gate insulating film is desirably in a range of 10 nm to 100 nm, for example. Note that, in the first embodiment, a thermally oxidized film of SiC is used as the gate insulating film, but various deposition films may be used as the gate insulating film.

Next, as shown in FIG. 9, the gate electrode 8 is formed as a deposition film in a predetermined region on the surface of the gate insulating film. That is, the gate electrode 8 is formed apart from the well region 5 with the gate insulating film interposed between the gate electrode 8 and the well region 5. As a material of the gate electrode 8, for example, polycrystalline silicon (poly-Si) is used.

Next, as shown in FIG. 10, after the interlayer insulating film 12 is formed as a deposition film, the source electrode 9 is formed. That is, the source electrode 9 is formed apart from the gate electrode 8 with the interlayer insulating film 12 interposed between the source electrode 9 and the gate electrode 8. As a material of the source electrode 9, for example, aluminum, titanium, nickel, gold, silver, copper, or the like is used. The source electrode 9 is formed by, for example, electron beam evaporation or sputtering. The source electrode 9 is in ohmic contact with the source region 7 and the well contact region 6.

Figure 11:
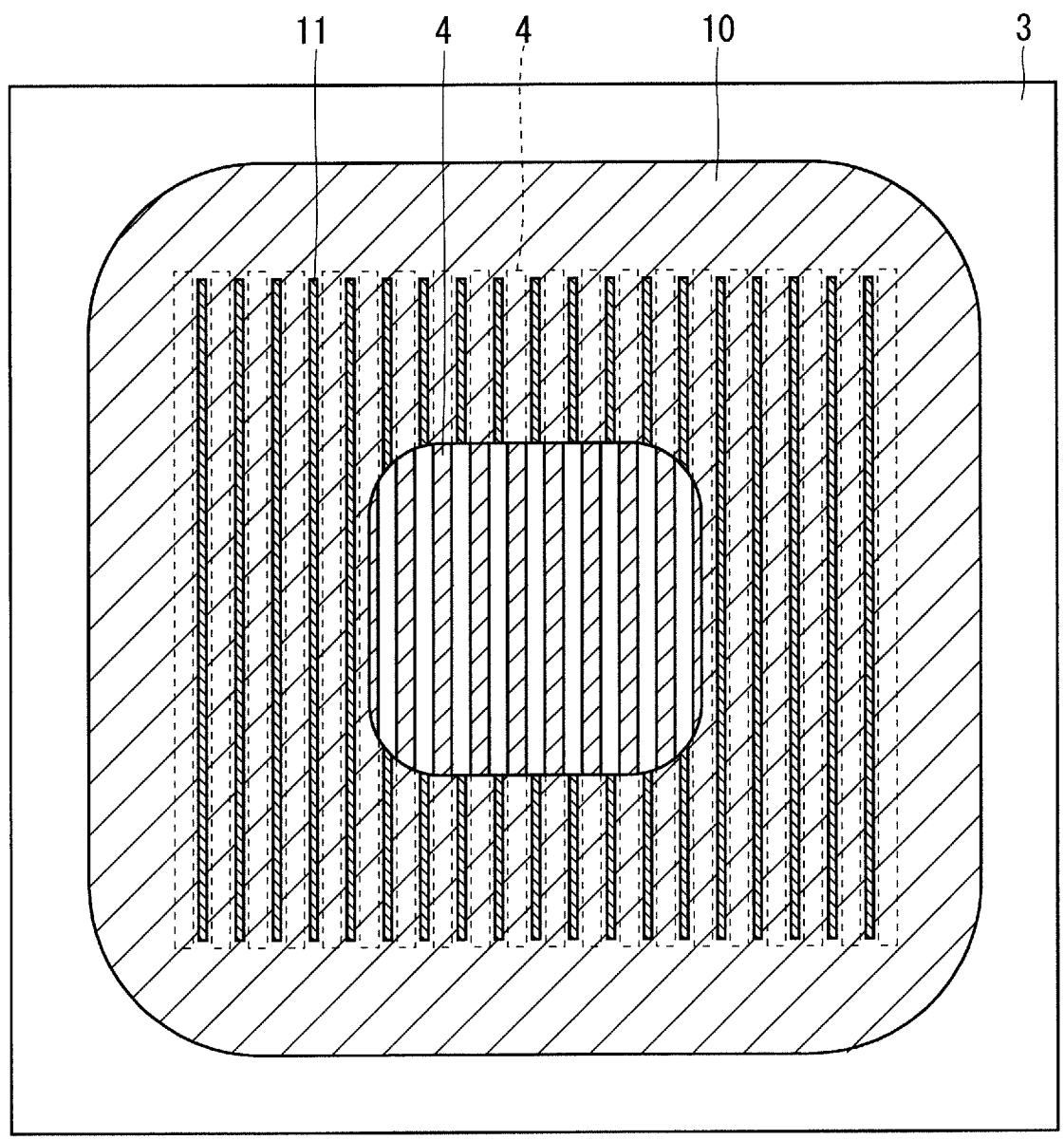
FIG. 11 is a plan view of the example of the structure of the semiconductor device according to the first embodiment of the present invention.

After the manufacturing process shown in FIG. 10, an insulating protection film 15 is formed as a deposition film on the source electrode 9 and the interlayer insulating film 12 in the edge termination region ET. Further, the drain electrode 14 is formed on a side of the SiC substrate 2 remote from the drift region 3. This results in the semiconductor device 1 shown in FIG. 1. FIG. 11 shows an example of a plan view of the semiconductor device 1 according to the first embodiment. As a material of the drain electrode 14, for example, aluminum, titanium, nickel, gold, silver, copper, or the like is used. The drain electrode 14 is formed by, for example, electron beam evaporation or sputtering.

As described above, according to the first embodiment, the semiconductor device 1 has a super-junction structure in which the drift region 3 of the first conductivity type and each of the pillar regions 4 of the second conductivity type are alternately arranged in the cell region CL and the edge termination region ET and includes the RESURF layer 10 of the second conductivity type formed across the plurality of pillar regions 4 in the edge termination region ET and the high-concentration region 11 of the second conductivity type formed in the surface of the RESURF layer 10, the high-concentration region 11 being higher in impurity concentration than the RESURF layer 10, and no pillar region 4 is formed under the high-concentration region 11 in the thickness direction, thereby preventing the high-concentration region 11 from being depleted even when a high voltage is applied to the drain electrode 14 to allow the pillar regions 4 to efficiently share potential and to allow potential balance among the pillar regions 4 to be uniformly held, which in turn allows the breakdown voltage of the edge termination region ET to be sufficiently secured.

The above effect is confirmed by the following simulation result. The simulation performed by the inventors is based on the assumption that the semiconductor device 1 is a planar gate SiC-SJ-MOSFET in which the impurity concentration of the drift region 3 of the first conductivity type is set to $3\times10^{16}$ cm$^{-3}$, the thickness of the drift region 3 is set to 10 µm, the impurity concentration of each of the pillar regions 4 of the second conductivity type is set to $9\times10^{16}$ cm$^{-3}$, the thickness of each of the pillar regions 4 is set to 8 µm, and the impurity concentration of the high-concentration region 11 of the second conductivity type is set to $1\times10^{17}$ cm$^{-3}$. A width of each of the pillar regions 4 is 2 µm, and each interval between the pillar regions 4 is 6 µm. A width of the high-concentration region 11 is 2 µm.

Figure 12:
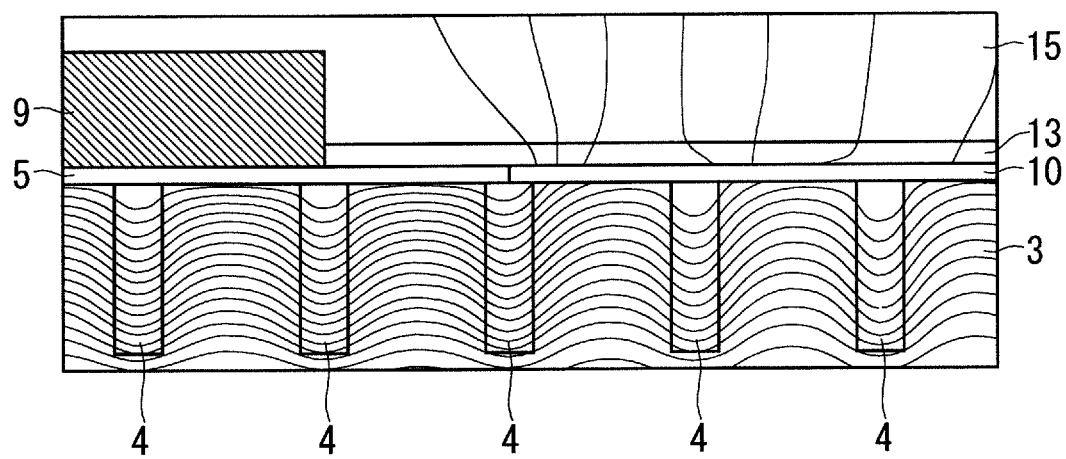
FIG. 12 is a diagram showing a result of simulating a state of equipotential lines during avalanche breakdown caused by application of a high voltage to a drain electrode according to the first embodiment of the present invention.
Figure 13:
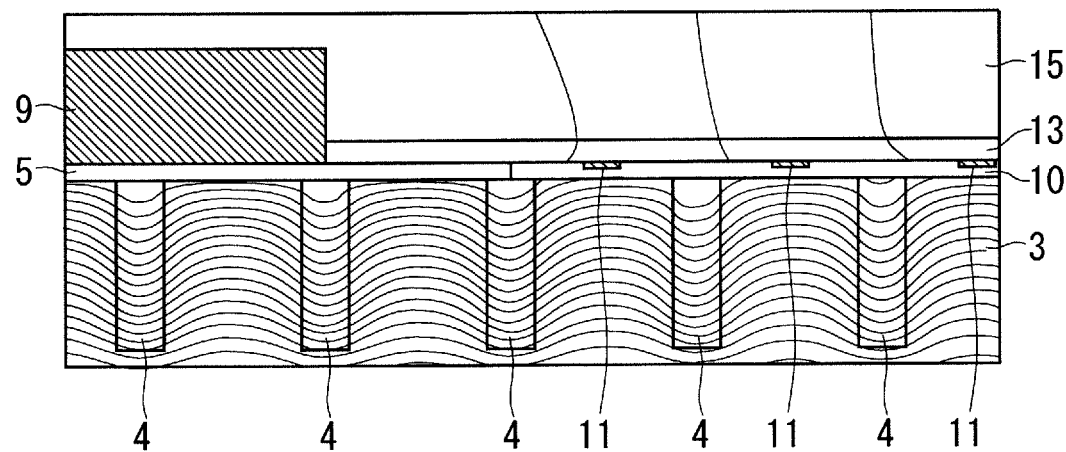
FIG. 13 is a diagram showing a result of simulating a state of equipotential lines during avalanche breakdown caused by application of a high voltage to the drain electrode according to first embodiment of the present invention.

FIGS. 12 and 13 are diagrams showing results of simulation of a state of equipotential lines during avalanche breakdown caused when a high voltage is applied to the drain electrode 14. FIG. 12 shows a structure in which the RESURF layer 10 is formed on each of the pillar regions 4, and FIG. 13 shows a structure in which the high-concentration region 11 that is higher in impurity concentration than the RESURF layer 10 is formed between the pillar regions 4 in the surface of the RESURF layer 10.

The structure shown in FIG. 12 shows that, in the vicinity of a junction between the RESURF layer 10 and a pillar region 4 that is closest to the well region 5, equipotential lines that pass through the field oxide film 13 from the RESURF layer 10 or the pillar region 4 to the insulating protection film 15 have narrow intervals and small curvature radii. That is, the structure shown in FIG. 12 shows that a high electric field concentrates at an upper end of the pillar region 4 during avalanche breakdown.

In contrast, the structure shown in FIG. 13 shows that equipotential lines that pass through the field oxide film 13 from the RESURF layer 10 or the pillar region 4 to the insulating protection film 15 have relatively wide intervals and relatively large curvature radii. That is, the structure shown in FIG. 13 shows that the high-concentration region 11 is not depleted during avalanche breakdown, thereby allowing the pillar regions 4 to efficiently share the potential and allowing the potential balance among the pillar regions 4 to be uniformly held.

From the above description, the simulation clearly shows that a difference between the structure shown in FIG. 12 and the structure shown in FIG. 13, that is, a difference between a configuration where the high-concentration region 11 is formed between the pillar regions 4 in the surface of the RESURF layer 10 and a configuration where no high-concentration region 11 is formed results in a difference in avalanche breakdown voltage by about 100 V.

As described above, the effect where the potential balance is uniformly held among the pillar regions 4 in the edge termination region ET is largely attributable to the fact that the high-concentration region 11 is not depleted and the potential is efficiently shared. Therefore, the high-concentration region 11 is desirably much higher in impurity concentration than the RESURF layer 10 (by, for example, 10 times or more of the impurity concentration of the RESURF layer 10).

Further, as can be seen from the simulation result shown in FIG. 13, the plurality of high-concentration regions 11 thus formed cause equipotential lines under the plurality of high-concentration regions 11 to be pushed downward, thereby making electric fields under the plurality of high-concentration regions 11 relatively large. If the high-concentration region 11 is larger in thickness than the RESURF layer 10, the electric field will concentrate under the high-concentration region 11, which is not preferable. Therefore, the high-concentration region 11 is desirably smaller in thickness than the RESURF layer 10. In particular, a semiconductor material, such as SiC, in which impurity diffusion hardly occurs, as compared with a semiconductor material such as Si in which impurity diffusion is likely to occur, allows the high-concentration region 11 to be much smaller in thickness than the RESURF layer 10, thereby solving the problem of electric field concentration as described above and allowing the breakdown voltage to be secured more satisfactorily.

Second Embodiment

Figure 14:
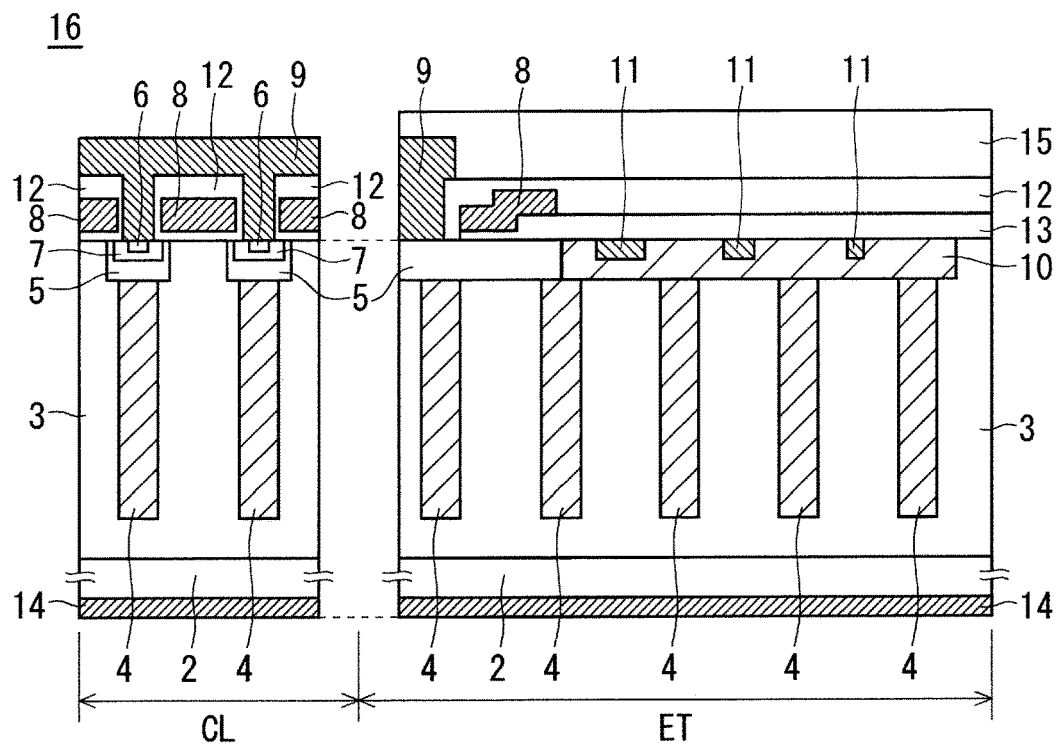
FIG. 14 is a cross-sectional view of an example of a structure of a semiconductor device according to a second embodiment of the present invention.

FIG. 14 is a cross-sectional view of an example of a structure of a semiconductor device 16 according to a second embodiment of the present invention, showing a cross section of a planar gate SiC-SJ-MOSFET using SiC as a semiconductor material.

In the semiconductor device 1 according to the first embodiment, the width of the high-concentration region 11 is constant. In contrast, the semiconductor device 16 according to the second embodiment has a characteristic that the width of the high-concentration region 11 decreases outward, that is, toward a periphery of the semiconductor device 16. That is, the width of the high-concentration region 11 decreases toward a side of the edge termination region ET remote from the cell region CL. Other structures and the manufacturing method are identical to the structures and the manufacturing method of the first embodiment; thus, descriptions of the other structures and the manufacturing method are omitted herein.

As described above, according to the second embodiment, the width of the high-concentration region 11 decreases toward the outside of the semiconductor device 16, thereby allowing a high-concentration region 11 located outside the other high-concentration regions 11 to share less potential when a high voltage is applied to the drain electrode 14. Therefore, potential sharing that is more efficient than the potential sharing in the semiconductor device 1 according to first embodiment is achieved, thereby allowing the potential balance among the pillar regions 4 to be uniformly held and thus allowing the breakdown voltage of the edge termination region ET to be more sufficiently secured.

Third Embodiment

Figure 15:
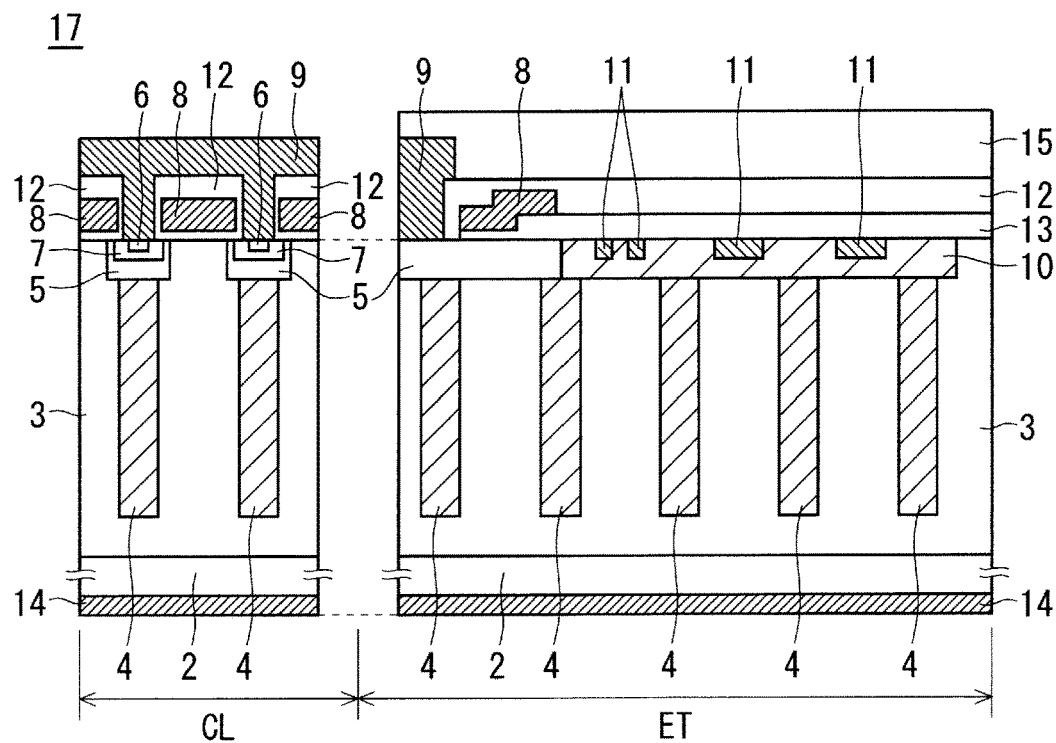
FIG. 15 is a cross-sectional view of an example of a structure of a semiconductor device according to a third embodiment of the present invention.

FIG. 15 is a cross-sectional view of an example of a structure of a semiconductor device 17 according to a third embodiment of the present invention, showing a cross section of a planar gate SiC-SJ-MOSFET using SiC as a semiconductor material.

The semiconductor devices 1, 16 according to the first and second embodiments each include one high-concentration region 11 between the pillar regions 4 in the surface of the RESURF layer 10. In contrast, the semiconductor device 17 according to the third embodiment has a characteristic that the semiconductor device 17 includes, in an interval direction of the pillar regions 4, a plurality of high-concentration regions 11 between the pillar regions 4 adjacent to each other with the RESURF layer 10 interposed between the pillar regions 4 in plan view. Other structures and the manufacturing method are identical to the structures and the manufacturing method of the first embodiment or the second embodiment; thus, descriptions of the other structures and the manufacturing method are omitted herein.

In the example shown in FIG. 15, a high-concentration region 11 closest to the cell region CL in the edge termination region ET of the semiconductor device 17 is divided into two regions. That is, the semiconductor device 17 includes two high-concentration regions 11 between the pillar regions 4 in the surface of the RESURF layer 10.

As described above, according to the third embodiment, the high-concentration region 11 closest to the cell region CL in the edge termination region ET of the semiconductor device 17 is divided into two regions, thereby allowing each of the high-concentration regions 11 to share less potential when a high voltage is applied to the drain electrode 14. Therefore, potential sharing that is more efficient than the potential sharing in the semiconductor device 1 according to first embodiment is achieved, thereby allowing the potential balance among the pillar regions 4 including the periphery of the semiconductor device 17 to be uniformly held and thus allowing the breakdown voltage of the edge termination region ET to be more sufficiently secured.

Note that, in the example shown in FIG. 15, a description has been given of the configuration where the high-concentration region 11 is divided into two regions, but the high-concentration region 11 may be divided into three or more regions. Further, not only the high-concentration region 11 closest to the cell region CL in the edge termination region ET but also other high-concentration regions 11 may be each divided into a plurality of regions. An increase in the number of divisions of each of the high-concentration regions 11 allows the potential to be shared more efficiently.

Fourth Embodiment

FIG. 16 is a plan view of an example of a structure of a semiconductor device according to a fourth embodiment of the present invention, showing a cross section of a planar gate SiC-SJ-MOSFET using SiC as a semiconductor material.

The semiconductor device according to the fourth embodiment has a characteristic that a plurality of high-concentration regions 11 are formed between pillar regions 4 adjacent to each other with the RESURF layer 10 interposed between the pillar regions 4 in plan view in a longitudinal direction of the pillar regions 4.

Figure 17:
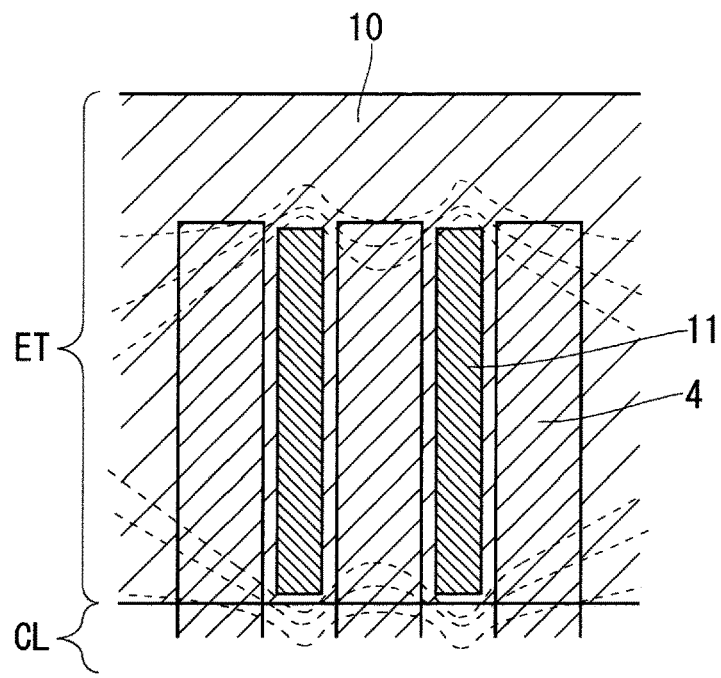
FIG. 17 is a conceptual diagram showing a state of equipotential lines during avalanche breakdown caused by application of a high voltage to a drain electrode according to the fourth embodiment of the present invention.
Figure 18:
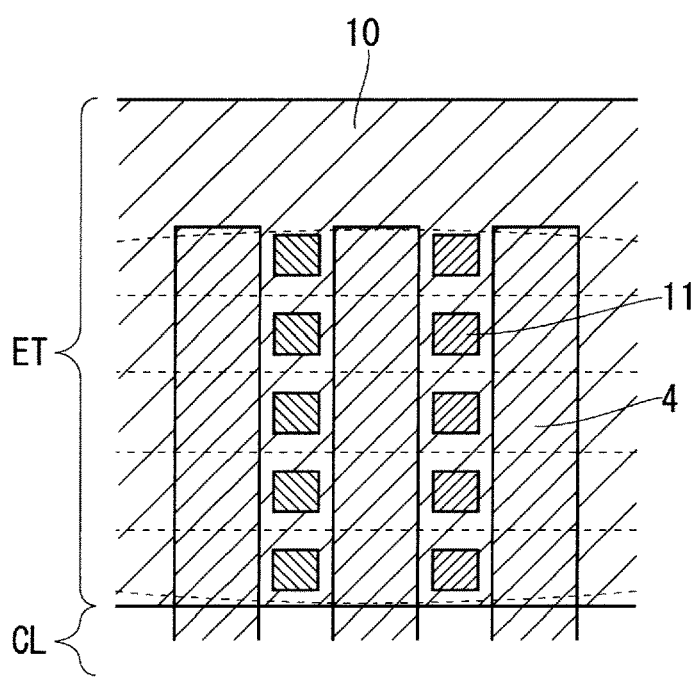
FIG. 18 is a conceptual diagram showing a state of equipotential lines during avalanche breakdown caused by application of a high voltage to the drain electrode according to the fourth embodiment of the present invention.

On a left side and a right side of the RESURF layer 10 provided around the cell region CL in plan view, equipotential lines are parallel to the longitudinal direction of the pillar regions 4. In contrast, on an upper side and a lower side of the RESURF layer 10, equipotential lines are orthogonal to the longitudinal direction of the pillar regions 4; thus, when the high-concentration regions 11 are formed as shown in FIG. 17, the equipotential lines may bend at ends of the high-concentration regions 11 to bring about electric field concentration. Therefore, as shown in FIG. 18, a plurality of high-concentration regions 11 are formed in the longitudinal direction of the pillar regions 4 (divided in the longitudinal direction of the pillar regions 4). This configuration allows the equipotential lines to pass through between the plurality of high-concentration regions 11, thereby allowing the equipotential lines to be smoothed and electric field relaxation to be achieved. Note that, in FIGS. 17 and 18, broken lines indicate the equipotential lines.

As described above, according to the fourth embodiment, when a high voltage is applied to the drain electrode 14, even on the upper side and the lower side of the RESURF layer 10 where the equipotential lines are orthogonal to the longitudinal direction of the pillar regions 4 in plan view, the equipotential lines can be smoothed, and the breakdown voltage of the edge termination region ET can be more sufficiently secured.

Fifth Embodiment

Figure 20:
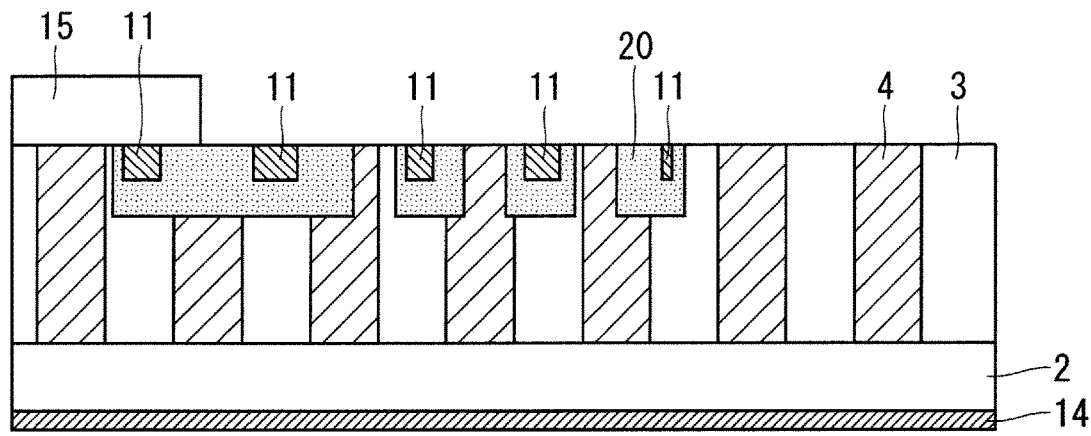
FIG. 20 is a cross-sectional view of the example of the structure of the semiconductor device according to the fifth embodiment of the present invention.

FIGS. 19 and 20 are respectively a plan view and a cross-sectional view of an example of a structure of a semiconductor device according to a fifth embodiment of the present invention, showing an example of a planar gate SiC-SJ-MOSFET using SiC as a semiconductor material.

The semiconductor devices according to the first to fourth embodiments each include the RESURF layer 10. In contrast, the semiconductor device according to the fifth embodiment has a characteristic that the semiconductor device includes a plurality of breakdown voltage holding structures 20. The plurality of breakdown voltage holding structures 20 have the second conductivity type that is the same as the RESURF layer 10 has and are provided in a ring shape around the cell region CL and apart from each other. This configuration allows a depletion layer that is stretched toward the drift region 3 and the pillar region 4 when a high voltage is applied to the drain electrode 14 to be expanded to the outside of the edge termination region ET, thereby allowing electric field relaxation to be achieved.

The problem that the potential balance among pillar regions 4 is lost in a structure in which an interval between the pillar regions 4 is large as in a planar gate SiC-SJ-MOSFET also occurs in a configuration where the RESURF layer 10 is provided and in a configuration where a plurality of breakdown voltage holding structures 20 are provided.

As described above, according to the fifth embodiment, a super-junction structure is employed in which the drift region 3 of the first conductivity type and the pillar region 4 of the second conductivity type are alternately arranged in the cell region CL and the edge termination region ET, the plurality of breakdown voltage holding structures 20 of the second conductivity type are formed extending in the thickness direction from surfaces of the drift region 3 and the pillar region 4 in the edge termination region ET, the plurality of breakdown voltage holding structures 20 being provided in a ring shape around the cell region CL and apart from each other, the high-concentration region 11 of the second conductivity type is formed in surfaces of the breakdown voltage holding structures 20, the high-concentration region 11 being higher in impurity concentration than the drift region 3, and no pillar region 4 is formed under the high-concentration region 11 in the thickness direction, thereby preventing the high-concentration region 11 from being depleted even when a high voltage is applied to the drain electrode 14 to allow the pillar regions 4 to efficiently share potential and to allow potential balance among the pillar regions 4 to be uniformly held, which in turn allows the breakdown voltage of the edge termination region ET to be sufficiently secured.

Sixth Embodiment

Figure 21:
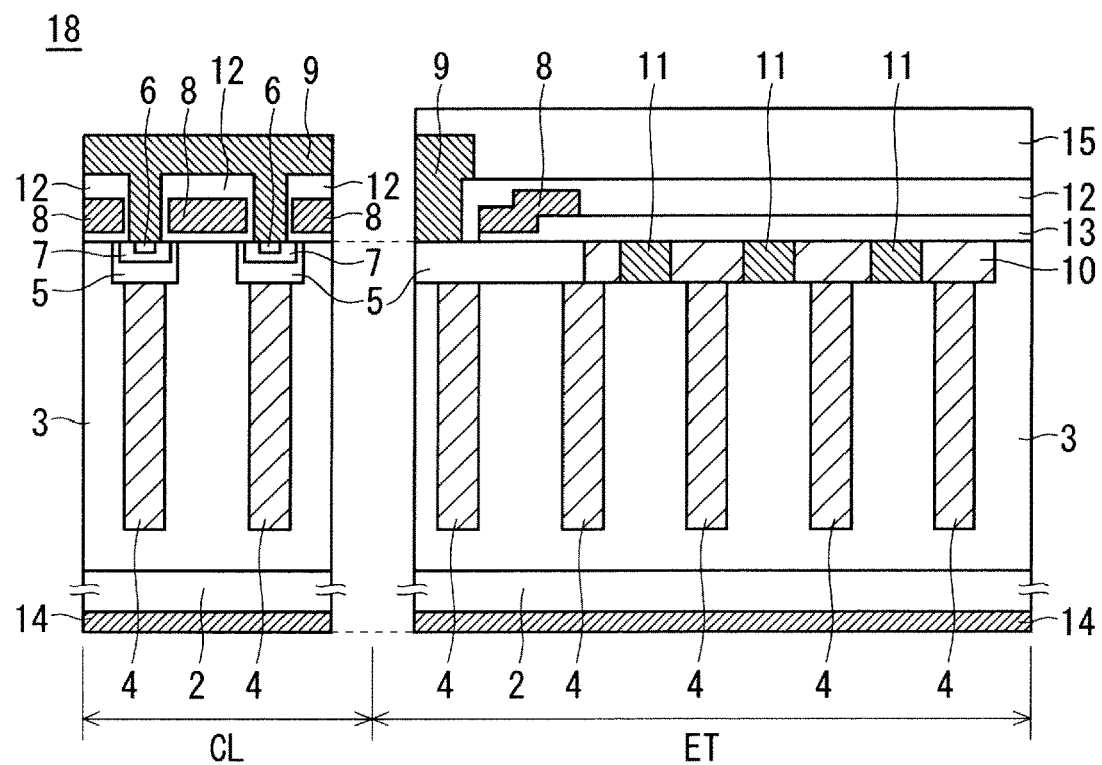
FIG. 21 is a cross-sectional view of an example of a structure of a semiconductor device according to a sixth embodiment of the present invention.

FIG. 21 is a cross-sectional view of an example of a structure of a semiconductor device 18 according to a sixth embodiment of the present invention, showing a cross section of a planar gate SiC-SJ-MOSFET using SiC as a semiconductor material.

In the semiconductor device 1 according to the first embodiment, the high-concentration region 11 is formed by ion implantation using a dedicated implantation mask that is used only for forming the high-concentration region 11. In contrast, the semiconductor device 18 according to the sixth embodiment has a characteristic that the high-concentration region 11 is formed in a process identical to a process in which the well region 5 is formed in the cell region CL. Other structures and the manufacturing method are identical to the structures and the manufacturing method of the first embodiment; thus, detailed descriptions of the other structures and the manufacturing method are omitted herein.

Specifically, the well region 5 and the high-concentration region 11 are both formed in the manufacturing process shown in FIG. 7 without the manufacturing process shown in FIG. 6 described in the first embodiment. The well region 5 is identical in impurity concentration to the high-concentration region 11, and the impurity concentration is desirably within a range of $1\times10^{17}$ cm$^{-3}$ to $1\times10^{19}$ cm$^{-3}$. Further, the well region 5 is identical in thickness to the high-concentration region 11, and the thickness is desirably within a range of 0.5 µm to 3 µm.

As described above, according to the sixth embodiment, as in the semiconductor device 1 according to the first embodiment, the high-concentration region 11 is not depleted even when a high voltage is applied to the drain electrode 14, thereby allowing the potential to be shared efficiently and the potential balance among the pillar regions 4 to be uniformly held, which in turn allows the breakdown voltage of the edge termination region ET to be sufficiently secured.

Seventh Embodiment

Figure 22:
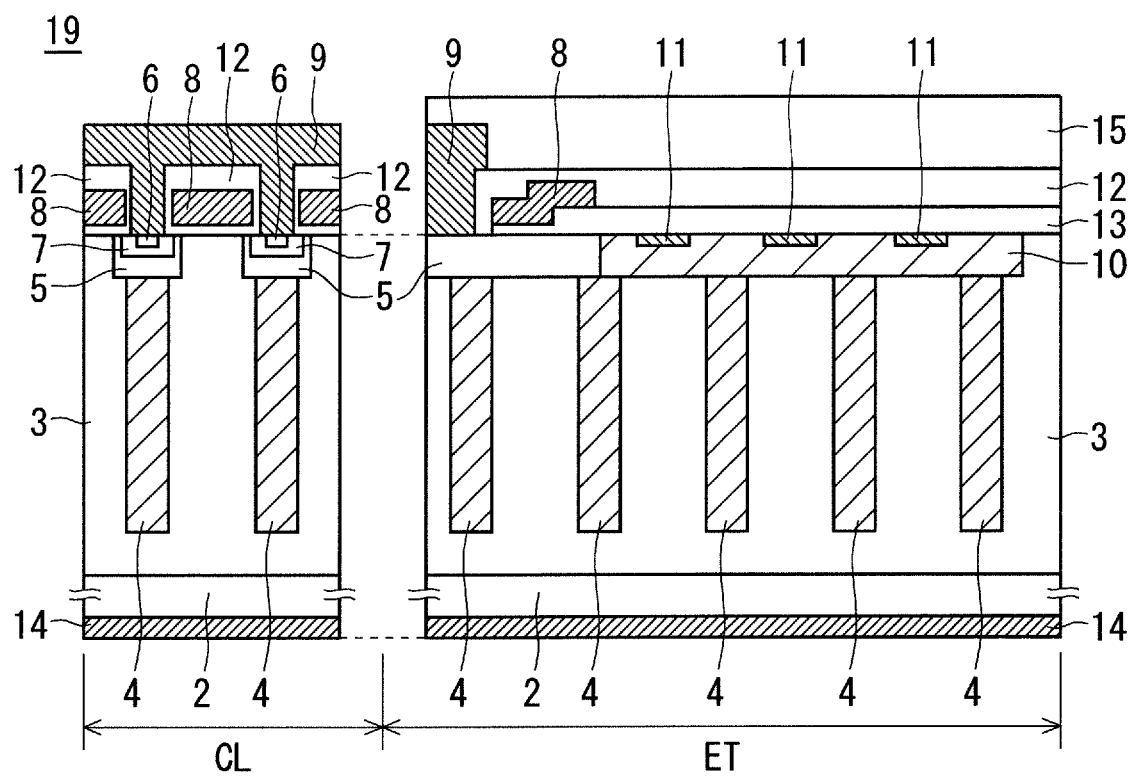
FIG. 22 is a cross-sectional view of an example of a structure of a semiconductor device according to a seventh embodiment of the present invention.

FIG. 22 is a cross-sectional view of an example of a structure of a semiconductor device 19 according to a seventh embodiment of the present invention, showing a cross section of a planar gate SiC-SJ-MOSFET using SiC as a semiconductor material.

In the semiconductor device 1 according to the first embodiment, the high-concentration region 11 is formed by ion implantation using a dedicated implantation mask that is used only for forming the high-concentration region 11. In contrast, the semiconductor device 19 according to the seventh embodiment has a characteristic that the high-concentration region 11 is formed in a process identical to a process in which the well contact region 6 is formed in the cell region CL. Other structures and the manufacturing method are identical to the structures and the manufacturing method of the first embodiment; thus, detailed descriptions of the other structures and the manufacturing method are omitted herein.

Specifically, the well contact region 6 and the high-concentration region 11 are both formed in the manufacturing process shown in FIG. 7 without the manufacturing process shown in FIG. 6 described in the first embodiment. The well contact region 6 is identical in impurity concentration to the high-concentration region 11, and the impurity concentration is desirably within a range of $1\times10^{19}$ cm$^{-3}$ to $1\times10^{21}$ cm$^{-3}$. Further, the well contact region 6 is identical in thickness to the high-concentration region 11, and the thickness is desirably within a range of 0.2 µm to 1 µm.

As described above, according to the seventh embodiment, as in the semiconductor device 1 according to the first embodiment, the high-concentration region 11 is not depleted even when a high voltage is applied to the drain electrode 14, thereby allowing the potential to be shared efficiently and the potential balance among the pillar regions 4 to be uniformly held, which in turn allows the breakdown voltage of the edge termination region ET to be sufficiently secured.

Note that, in the first to seventh embodiments, descriptions have been given of a planar gate MOSFET as an example of the semiconductor device, but even with a trench gate MOSFET, configuring the trench gate MOSFET in accordance with any one of the first to seventh embodiments allows the breakdown voltage of the edge termination region in the junction structure to sufficiently secured.

A crystal form and a conductivity type of SiC, and preferred ranges of numerical values such as a specific thickness and impurity concentration of each layer are well known to those skilled in the art, and the numerical values described in the first to seventh embodiments can be appropriately changed.

In the above descriptions, the first conductivity type denotes n type, and the second conductivity type denotes p type; however, the seventh embodiment of the present invention is not limited thereto. The first conductivity type may denote p type, and the second conductivity type may denote n type.

Note that the present invention can be implemented by any combination of the embodiments within the scope of the present invention, and each of the embodiments can be deformed or omitted as appropriate.

Although the present invention has been described in detail, the above descriptions are illustrative in all aspects, and the present invention is not limited by the descriptions. It is understood that innumerable modifications not illustrated can be envisaged without departing from the scope of the present invention.

EXPLANATION OF REFERENCE SIGNS

1: Semiconductor device
2: SiC substrate
3: Drift region
4: Pillar region
5: Well region
6: Well contact region
7: Source region
8: Gate electrode
9: Source electrode
10: RESURF layer
11: High-concentration region
12: Interlayer insulating film
13: Field oxide film
14: Drain electrode
15: Insulating protection film
16, 17, 18, 19: Semiconductor device

The invention claimed is:

1. A semiconductor device having a cell region that is an operation region and an edge termination region provided around the cell region in plan view, the semiconductor device comprising:
a substrate;
a drift region of a first conductivity type and pillar regions of a second conductivity type, the drift region extending in a thickness direction on the substrate and the pillar regions extending in the thickness direction over the substrate, the drift region and the pillar regions being alternately formed in an orthogonal direction with respect to the thickness direction across the cell region and the edge termination region;
a reduced surface field (RESURF) layer of the second conductivity type formed across a plurality of the pillar regions in the edge termination region and extending in the thickness direction from surfaces of the drift region and the pluarality of pillar regions; and
a high-concentration region of the second conductivity type formed in a surface of the RESURF layer, the high-concentration region being higher in impurity concentration than the RESURF layer,
wherein no pillar region is formed under the high-concentration region in the thickness direction.

2. The semiconductor device according to claim 1, wherein a plurality of high-concentration regions are respectively formed between pairs of the pillar regions across which the RESURF layer is formed.

3. The semiconductor device according to claim 2, wherein a width of the high-concentration regions in the orthogonal direction decreases toward a side of the edge termination region remote from the cell region.

4. The semiconductor device according to claim 1, wherein a plurality of high-concentration regions are formed between the pillar regions that are adjacent to each other with the RESURF layer interposed between the pillar regions in plan view in an interval direction of the pillar regions.

5. The semiconductor device according to claim 1, wherein the high-concentration region is smaller in thickness than the RESURF layer.

6. The semiconductor device according to claim 1, wherein the high-concentration region is higher in impurity concentration than the RESURF layer by 10 times or more.

7. The semiconductor device according to claim 1, wherein a plurality of high-concentration regions are formed between the pillar regions that are adjacent to each other with the RESURF layer interposed between the pillar regions in plan view in a longitudinal direction of the pillar regions.

8. A semiconductor device having a cell region that is an operation region and an edge termination region provided around the cell region in plan view, the semiconductor device comprising:
a substrate;
a drift region of a first conductivity type and a pillar region of a second conductivity type, the drift region extending in a thickness direction on the substrate, the pillar region extending in the thickness direction over the substrate, the drift region and the pillar region being alternately formed in an orthogonal direction with respect to the thickness direction across the cell region and the edge termination region;
a plurality of breakdown voltage holding structures of the second conductivity type formed extending in the thickness direction from surfaces of the drift region and the pillar region in the edge termination region, the plurality of breakdown voltage holding structures being provided in a ring shape around the cell region and apart from each other; and
a high-concentration region of the second conductivity type formed in surfaces of the breakdown voltage holding structures, the high-concentration region being higher in impurity concentration than the drift region,
wherein no pillar region is formed under the high-concentration region in the thickness direction.

9. The semiconductor device according to claim 8, wherein the pillar region is formed extending from the surface to the substrate.

10. A method for manufacturing a semiconductor device having a cell region that is an operation region and an edge termination region provided around the cell region in plan view, the method comprising the steps of:
(a) preparing a substrate;
(b) forming a drift region of a first conductivity type and pillar regions of a second conductivity type, the drift region extending in a thickness direction on the substrate and the pillar regions extending in the thickness direction over the substrate, the drift region and the pillar regions being alternately formed in an orthogonal direction with respect to the thickness direction across the cell region and the edge termination region;
(c) forming a RESURF layer of the second conductivity type across a plurality of the pillar regions in the edge termination region, the RESURF layer extending in the thickness direction from surfaces of the drift region and the plurality of pillar regions; and
(d) forming a high-concentration region of the second conductivity type in a surface of the RESURF layer, the high-concentration region being higher in impurity concentration than the RESURF layer, no pillar region being formed under the high-concentration region in the thickness direction.

11. The method for manufacturing a semiconductor device according to claim 10, wherein
in step (d), a well region of the second conductivity type is formed extending in the thickness direction from the surface of the pillar regions in the cell region, and
the high-concentration region is formed simultaneously with the well region.

12. The method for manufacturing a semiconductor device according to claim 10, wherein
in step (d), a well contact region of the second conductivity type is formed extending in the thickness direction from the surface of the pillar regions in the cell region, and
the high-concentration region is formed simultaneously with the well contact region.

13. The semiconductor device according to claim 1, wherein the pillar regions are formed extending from the surface to the substrate.

* * * * *